(12) United States Patent
Zhuang et al.

(10) Patent No.: US 10,177,772 B2
(45) Date of Patent: Jan. 8, 2019

(54) FRACTIONAL-N PHASE LOCKED LOOP DELTA SIGMA MODULATOR NOISE REDUCTION USING CHARGE PUMP INTERPOLATION

(71) Applicant: QUALCOMM Incorporated, San Diego, CA (US)

(72) Inventors: Jingcheng Zhuang, San Diego, CA (US); Xinhua Chen, San Diego, CA (US); Frederic Bossu, San Diego, CA (US); Yiwu Tang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/272,307

(22) Filed: Sep. 21, 2016

(65) Prior Publication Data

US 2018/0019756 A1 Jan. 18, 2018

Related U.S. Application Data

(60) Provisional application No. 62/363,110, filed on Jul. 15, 2016.

(51) Int. Cl.
| | |
|---|---|
| *H03L 7/087* | (2006.01) |
| *H03L 7/099* | (2006.01) |
| *H03L 7/197* | (2006.01) |
| *H04L 7/033* | (2006.01) |
| *H03L 7/089* | (2006.01) |
| *H03L 7/191* | (2006.01) |

(52) U.S. Cl.
CPC ............ *H03L 7/087* (2013.01); *H03L 7/0898* (2013.01); *H03L 7/099* (2013.01); *H03L 7/191* (2013.01); *H03L 7/1974* (2013.01); *H04L 7/033* (2013.01); *H03L 7/1976* (2013.01)

(58) Field of Classification Search
CPC ....... H03L 7/08; H03L 7/0802; H03L 7/0805; H03L 7/0807; H03L 7/083; H03L 7/085; H03L 7/093; H03L 7/095; H03L 7/097; H03L 7/099; H03L 7/10; H03L 7/14; H03L 7/16; H03L 7/18; H03L 7/20; H03L 7/089
USPC .......................................... 327/156, 158, 161
See application file for complete search history.

(56) References Cited

U.S. PATENT DOCUMENTS

| | | | |
|---|---|---|---|
| 6,553,089 B2 * | 4/2003 | Huh | ........................ H03L 7/087 327/156 |
| 7,880,516 B2 | 2/2011 | Beaulaton et al. | |
| | | (Continued) | |

FOREIGN PATENT DOCUMENTS

WO    2004021574 A1    3/2004

OTHER PUBLICATIONS

Cowan G.E.R., et al., "Phase-Locked Loop Architecture for Enhanced Voltage-Controlled Oscillator Phase-Noise Suppression", IEEE International Symposium on Circuits and Systems, May 23, 2013, pp. 2476-2479.

(Continued)

*Primary Examiner* — John W Poos
(74) *Attorney, Agent, or Firm* — Qualcomm Incorporated/Seyfarth Shaw LLP; Alan M. Lenkin (57) ABSTRACT

A phase locked loop has a frequency divider included in a feedback path. The frequency divider generates a first output and a delayed output. The phase locked loop also includes a charge pump to generate an output current based on the first output and the delayed output of the frequency divider.

19 Claims, 10 Drawing Sheets

(56) References Cited

U.S. PATENT DOCUMENTS

| | | | |
|---|---|---|---|
| 7,899,422 B1 | 3/2011 | Teo et al. | |
| 8,384,456 B1* | 2/2013 | Ramaswamy | H03L 7/0891 327/149 |
| 8,537,952 B1* | 9/2013 | Arora | H03C 3/0925 375/354 |
| 2007/0126484 A1* | 6/2007 | Lin | H03L 7/0891 327/156 |
| 2009/0153253 A1* | 6/2009 | Mei | G11C 7/22 331/10 |
| 2011/0037523 A1* | 2/2011 | Roine | H03L 7/085 331/10 |

OTHER PUBLICATIONS

Syllaios I.L., et al., "DPLL with Hybrid ΔΣ Phase/Frequency Detector," IEEE International Symposium on Circuits and Systems, May 27, 2015, pp. 2569-2572.

Zhang L., et al., "A Hybrid Spur Compensation Technique for Finite-Modulo Fractional-N Phase-Locked Loops", IEEE Journal of Solid-State Circuits, vol. 44, No. 11, Nov. 2009, pp. 2922-2934.

Hedayati H., et al., "A 1 MHz Bandwidth, 6 GHz 0.18 μm CMOS Type—I ΔΣ Fractional-N Synthesizerr for WiMAX Applications", IEEE Journal of Solid-state Circuits, vol. 44, No. 12, Dec. 1, 2009, pp. 3244-3252, XP011285544, ISSN: 0018-9200, DOI: 10.1109/JSSC.2009.2032713.

International Search Report and Written Opinion—PCT/US2017/040978—ISA/EPO—dated Oct. 16, 2017.

Meninger S.E., et al., "A Fractional-N Frequency Synthesizer Architecture Utilizing a Mismatch Compensated PFD/DAC Structure for Reduced Quantization-Induced Phase Noise," IEEE Transactions on Circuits and Systems-II: Analog and Digital Signal Processing, Nov. 2003, vol. 50 (11), pp. 839-849.

Nandwana R.K., et al., "A Calibration-Free Fractional-N Ring PLL Using Hybrid Phase/Current-Mode Phase Interpolation Method", IEEE Journal of Solid-state Circuits, vol. 50, No. 4, Apr. 1, 2015, pp. 882-895, XP011576721, ISSN: 0018-9200, DOI: 10.1109/JSSC.2014.2385756 [retrieved on Mar. 24, 2015].

* cited by examiner

FRACTIONAL-N PHASE LOCKED LOOP DELTA SIGMA MODULATOR NOISE REDUCTION USING CHARGE PUMP INTERPOLATION

CROSS-REFERENCE TO RELATED APPLICATION

The present application claims the benefit of U.S. Provisional Patent Application No. 62/363,110, filed on Jul. 15, 2016, and titled "FRACTIONAL-N PHASE LOCKED LOOP DELTA SIGMA MODULATOR NOISE REDUCTION USING CHARGE PUMP INTERPOLATION," the disclosure of which is expressly incorporated by reference herein in its entirety.

BACKGROUND

Technical Field

The present disclosure relates generally to electronic circuitry, and more specifically to a phase locked loop with noise reduction.

Background

Phase locked loops are commonly used in telecommunications, computers and other electronics applications that utilize a precise clock for coordinating and synchronizing activities. A phase locked loop (PLL) forces an oscillator (e.g., voltage controlled oscillator (VCO) or digitally controlled oscillator (DCO)) to replicate or track a reference frequency and phase at an input when the PLL is in lock configuration. When locked, the frequencies of the input (e.g., at a phase detector) and output (e.g., at a VCO) are tracked exactly (e.g., input frequency=output frequency). A phase offset, however, may exist between the input and output.

A PLL reference frequency may be derived from a local oscillator (e.g., crystal oscillator (XO)). For example, a frequency of the crystal oscillator may be around tens of megahertz (MHz) while a frequency of the VCO may be specified to generate a periodic signal in the GHz range. In this case, a frequency divider by N is interposed between the VCO and the phase detector. When locked, the frequencies at an output of the PLL (e.g., at a VCO) track exactly at a fractional N times the frequency at an input of the PLL (e.g., at a phase detector). For example, N*input frequency is equal to the output frequency. Thus, the output frequency of the VCO is set at a fractional multiple of the frequency by the frequency divider. The frequency divider modulus control might be scrambled by a digital delta-sigma modulator (DSM). That is, a conventional fractional PLL is implemented using DSM dithering in the feedback frequency divider with the phase quantization step equal to one VCO period. It may be desirable for the output of the frequency divider to match the input of a reference frequency. In conventional PLLs, it is very difficult to precisely match the input and instead it may take multiple cycles, which on average produce the desired frequency.

The conventional divider can only divide by integers, not real numbers (e.g., 10.2). So to accomplish such ratios, the conventional PLL adjusts the oscillator back and forth, speeding up in one VCO cycle and slowing down in another VCO cycle, such that the average of the cycles produces the desired frequency. Each adjustment may include dithering the division ratio in the time domain, such that in each cycle there is a different division ratio. Each adjustment may result in DSM noise.

SUMMARY

In an aspect of the present disclosure, a phase locked loop has a frequency divider in a feedback path. The frequency divider generates a first output and a delayed output. The phase locked loop also includes a charge pump to generate an output based on the first output and the delayed output of the frequency divider.

In another aspect of the present disclosure, a method of reducing noise in a phase locked loop is presented. The method includes generating, by a frequency divider included in a feedback path, a first output and a delayed output. The method also includes generating, by a charge pump, an output current based on the first output and the delayed output of the frequency divider.

In yet another aspect of the present disclosure, a phase locked loop is presented. The phase locked loop includes means for generating a first output and a delayed output. The phase locked loop further includes means for generating an output based at least in part on the first output and the delayed output.

In still another aspect of the present disclosure, a non-transitory computer readable medium records program code for reducing noise in a phase locked loop. The program code is executed by a processor and includes program code to generate a first output and a delayed output via a frequency divider included in a feedback path. The program code also includes program code to generate an output via a charge pump based on the first output and the delayed output.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

Aspects and features of the present disclosure will be more apparent by describing example aspects with reference to the accompanying drawings, in which.

DETAILED DESCRIPTION

While a number of aspects are described herein, these aspects are presented by way of example only, and are not intended to limit the scope of protection. The apparatuses and methods described herein may be embodied in a variety of other forms. Furthermore, various omissions, substitutions, and changes in the form of the example apparatuses and methods described herein may be made without departing from the scope of protection.

Aspects of the present disclosure are directed to a phase locked loop (PLL) implementation that achieves delta sigma modulation (DSM) noise reduction. In accordance with aspects of the present disclosure, an additional output may be produced from the frequency divider such that the phase frequency detector and charge pump may perform interpolation so the equivalent output phase has a much finer resolution (e.g., finer than a voltage controlled oscillator (VCO) period).

In one aspect of the disclosure, a PLL feedback system includes a VCO, a phase frequency detector (PFD), a charge pump, a loop filter (e.g., low pass filter), and a feedback frequency divider (e.g., integer-N synthesizer or fractional synthesizer) with multiple outputs. The PLL system may be integrated in a mobile communication device. For example, the PLL system may be implemented in a radio frequency (RF) module of the mobile communication device.

The outputs of the feedback frequency divider may be supplied to the phase detector, which may be coupled to the loop filter via the charge pump. The loop filter may be coupled to the VCO. The VCO, in turn, may be coupled to the frequency divider and the frequency divider may be coupled to the phase detector to form the feedback loop (closed loop). The output of the VCO may be a frequency sinusoid that is controlled by a tuning voltage, Vtune, which is received by the VCO from the loop filter. For example, changing the tuning voltage changes the frequency of the VCO. To synthesize a desirable or exact frequency of the VCO, the VCO is included in the closed loop to feed back the VCO signal to the frequency divider. The phase detector compares an output of the frequency divider with a signal generated by the local oscillator.

For example, if the reference frequency of a crystal oscillator is 40 MHz and the output of the VCO is 4 GHz, the frequency divider receives the 4 GHz output of the VCO. The frequency divider is programmed to divide by 100 to provide an output frequency to the phase detector that matches the reference frequency received at the phase detector. The phase detector compares a phase of the reference frequency and the output frequency of the frequency divider and generates an error signal, proportional to a phase difference between the two frequencies. In some implementations, an analog multiplier or mixer can be used as a phase detector. Because the reference frequency and the output from the frequency divider are the same when the loop is locked, the output of the phase detector contains a low-frequency component and additional noise at high frequencies. The low-frequency component is proportional to the phase difference. The high-frequency component is removed by the low pass filter. Any phase difference may be presented as a control voltage (e.g., tuning voltage (Vtune)) to the VCO after filtering.

Figure 1:
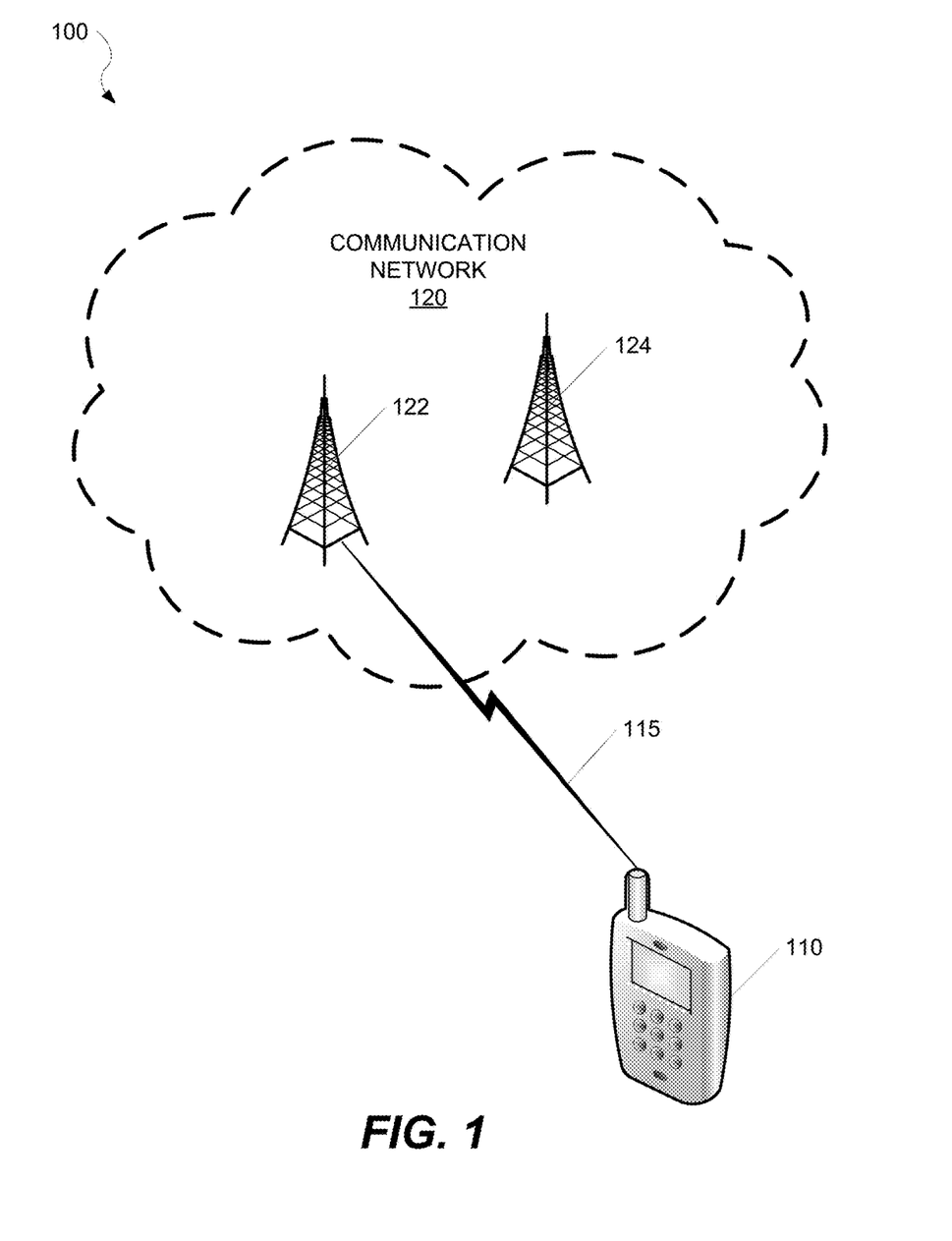
FIG. 1 is a system diagram illustrating a network environment according to various aspects of the present disclosure.

FIG. 1 is a system diagram illustrating an exemplary network environment 100 in accordance with aspects of the present disclosure. Referring to FIG. 1, a communication network 120 may include one or more evolved universal mobile telecommunications system (UMTS) terrestrial radio access (E-UTRA) Node Bs (eNodeBs) including, for example, but not limited to, a first eNodeB 122 and a second eNodeB 124. The communication network 120 may be, for example, but not limited to, a wireless or mobile communication network.

The communication network 120 may be an LTE communication network. However, a person having ordinary skill in the art can appreciate that the communication network 120 may support different and/or additional radio access technologies (RATs), including, for example, but not limited to, wideband code division multiple access (WCDMA), global system for mobile communications (GSM), and time division-synchronous code division multiple access (TD-SCDMA) without departing from the scope of the present disclosure.

A mobile communication device 110 may communicate with the communication network 120 on a subscription 115 via the first eNodeB 122. For example, the mobile communication device 110 may transmit data to and receive data from the communication network 120 via the first eNodeB 122. A person having ordinary skill in the art can appreciate that the mobile communication device 110 may communicate with the communication network 120 on the subscription 115 via a different eNodeB (e.g., the second eNodeB 124) without departing from the scope of the present disclosure. Moreover, a person having ordinary skill in the art can appreciate that the mobile communication device 110 may communicate with different and/or additional communication networks on the subscription 115 and/or a different subscription without departing from the scope of the present disclosure.

Figure 2:
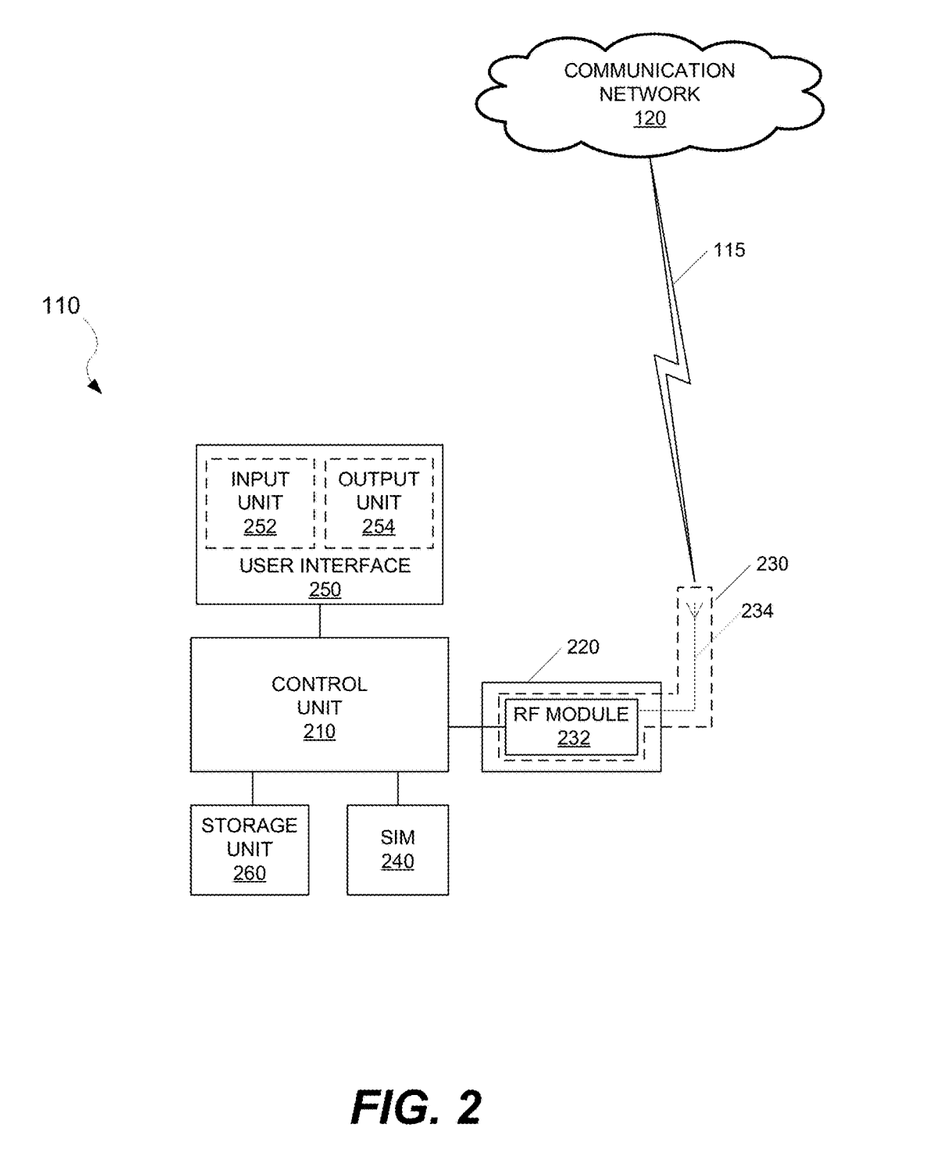
FIG. 2 is a block diagram illustrating a mobile communication device according to various aspects of the present disclosure.

FIG. 2 is a block diagram illustrating an exemplary mobile communication device 110 in accordance with aspects of the present disclosure. Referring to FIGS. 1 and 2, the mobile communication device 110 may include a control unit 210, a communication unit 220, a subscriber identity module (SIM) 240, a user interface 250, and a storage unit 260.

The mobile communication device 110 may be any device capable of wirelessly communicating with one or more communication networks including, for example, but not limited to, the communication network 120. The mobile communication device 110 may be, for example, but not limited to, a smartphone, a tablet PC, or a laptop computer.

The SIM 240 may associate the communication unit 220 with the subscription 115 on the communication network 120. Although the mobile communication device 110 is shown to include a single SIM (e.g., the SIM 240), a person having ordinary skill in the art can appreciate that the mobile communication device 110 may include additional SIMS without departing from the scope of the present disclosure. The additional SIMS may associate the communication unit 220 with a different subscription on the communication network 120 or a different communication network.

The SIM 240 may be a universal integrated circuit card (UICC) that is configured with SIM and/or universal SIM (USIM) applications, enabling access to GSM and/or UMTS networks. The UICC may also provide storage for a phone book and other applications. Alternatively, in a CDMA network, a SIM may be a UICC removable user identity module (R-UIM) or a CDMA subscriber identity module (CSIM) on a card. A SIM card may have a central processing unit (CPU), read-only memory (ROM), random-access memory (RAM), electrically erasable programmable read-only memory (EEPROM) and input/output (I/O) circuits. An integrated circuit card identity (ICCID) SIM serial number may be printed on the SIM card for identification. However, a SIM may be implemented within a portion of memory of the mobile communication device 110, and thus need not be a separate or removable circuit, chip, or card.

The communication unit 220 may include an RF chain 230. The RF chain 230 may include, for example, but not limited to, an RF module 232 and an antenna 234. Although the mobile communication device 110 is shown to include a single communication unit (e.g., the communication unit 220), a person having ordinary skill in the art can appreciate that the mobile communication device 110 may include additional communication units without departing from the scope of the present disclosure.

The user interface 250 may include an input unit 252. The input unit 252 may be, for example, but not limited to, a keyboard or a touch screen. The user interface 250 may further include an output unit 254. The output unit 254 may be, for example, but not limited to, a liquid crystal display (LCD) or a light emitting diode (LED) display. A person having ordinary skill in the art will appreciate that other types or forms of input and output units may be used without departing from the scope of the present disclosure.

The control unit 210 may be configured to control the overall operation of the mobile communication device 110 including controlling the functions of the communication unit 220 including, for example, but not limited to, frequency synthesis performed by the RF module 232. The control unit 210 may be, for example, but not limited to, a microprocessor (e.g., general-purpose processor, baseband modem processor, etc.) or a microcontroller.

The storage unit 260 may be configured to store application programs, application data, and user data. At least some of the application programs stored at the storage unit 260 may be executed by the control unit 210 for the operation of the mobile communication device 110.

Figure 3:
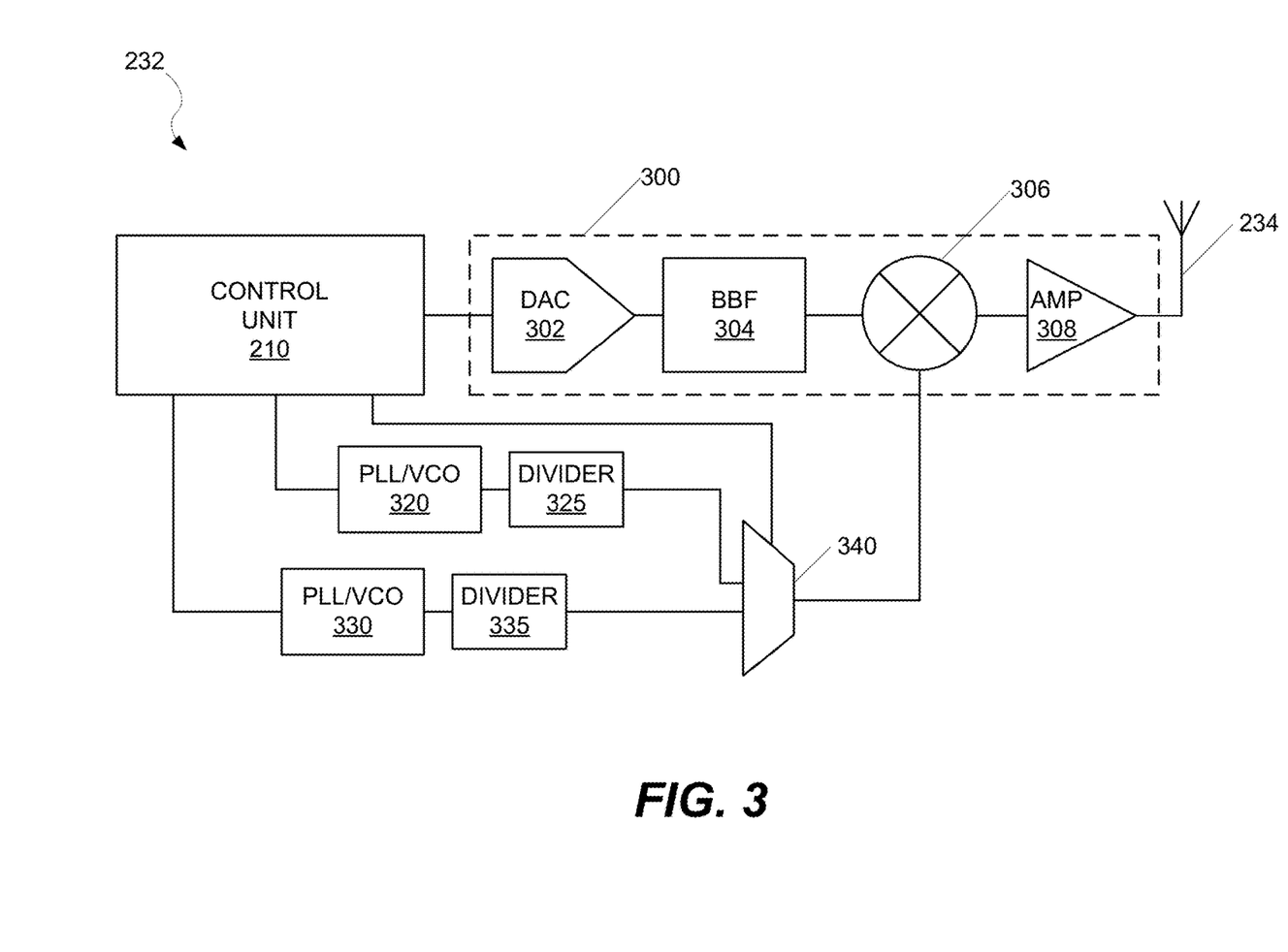
FIG. 3 is a block diagram illustrating a radio frequency (RF) module according to some aspects of the present disclosure.

FIG. 3 is a block diagram illustrating the RF module 232 according to some aspects. Referring to FIGS. 1, 2, and 3, the RF module 232 may include a transmit path 300 and a PLL selector 340.

The RF module 232 may further include a plurality of local oscillators (LO). The oscillators may comprise multiple phase locked loops (PLLs) with corresponding voltage controlled oscillators (VCOs) (PLL/VCOs) including, for example, but not limited to, a first PLL/VCO 320 and a second PLL/VCO 330. According to one exemplary aspect, the RF module 232 may include two PLL/VCOs (e.g., the first PLL/VCO 320 and the second PLL/VCO 330).

The first PLL/VCO 320 may be coupled with a first divider 325. The first PLL/VCO 320 may receive a reference signal having a reference frequency $F_{ref}$ from the control unit 210 and output a signal to the first divider 325. The combination of the first PLL/VCO 320 and the first divider 325 may be configured to generate and output a frequency divided signal that is synchronized to the phase and the frequency (e.g., $F_{ref}$) of the reference signal.

The second PLL/VCO 330 may be coupled with a second divider 335. The second PLL/VCO 330 may receive a reference signal having a reference frequency $F_{ref}$ from the control unit 210 and output a signal to the second divider 335. The combination of the second PLL/VCO 330 and the second divider 335 may be configured to generate and output a signal that is synchronized to the phase and the frequency (e.g., $F_{ref}$) of the reference signal.

In one implementation, an output signal from a PLL/VCO may be an undivided output signal, thus allowing for the omission of dividers.

The mobile communication device 110 may transmit data to the communication network 120 via the transmit path 300 according to a current resource block (RB) allocation. The control unit 210 may receive from the communication network 120 an upcoming RB allocation for the mobile communication device 110. For example, the control unit 210 may be notified of the upcoming RB allocation on the physical downlink control channel (PDCCH) in advance (e.g., 4-8 slot periods).

The upcoming RB allocation may be different from a current RB allocation. For example, the upcoming RB allocation may have a different bandwidth and/or frequency range than the current RB allocation. A single RB may have a bandwidth of about 180 kHz, but other bandwidths may be used.

In one aspect, in order for the mobile communication device 110 to transmit data according to the upcoming RB allocation, the control unit 210 may select one of the first PLL/VCO 320 and the second PLL/VCO 330 that is not currently in use. The control unit 210 may tune the selected one of the first PLL/VCO 320 and the second PLL/VCO 330 to a target frequency based on a bandwidth of the upcoming RB allocation (e.g., number of allocated RBs).

For example, if the bandwidth of the upcoming RB allocation is narrow (e.g., number of allocated RBs less than or equal to a threshold x, where x may be equal to 6 or another integer value), the control unit 210 may tune the selected one of the first PLL/VCO 320 and the second PLL/VCO 330 to a frequency corresponding to the allocated RBs (e.g., center frequency of the allocated RBs).

In one exemplary aspect, the control unit 210 may determine the frequency corresponding to the upcoming RB allocation based on a lookup table (LUT). For example, the control unit 210 may determine, based on the LUT, the target frequency to tune the selected one of the first PLL/VCO 320 and the second PLL/VCO 330 in order for the mobile communication device 110 to transmit data in accordance with the upcoming RB allocation. In various aspects, the LUT may provide correlations between one or more RB allocations (e.g., in each frequency band) and target frequencies to tune each of a the PLL/VCOs including, for example, but not limited to, the first PLL/VCO 320 and/or the second PLL/VCO 330.

Alternately, if the bandwidth of the upcoming RB allocation is not narrow (e.g., number of allocated RBs greater than x, where x may be equal to 6 or another integer value), the control unit 210 may tune the selected one of the first PLL/VCO 320 and the second PLL/VCO 330 to a frequency corresponding to an assigned channel (e.g., center frequency of assigned E-UTRA absolute radio frequency channel number (EARFCN)).

The control unit 210 may perform coarse tuning (CT) calibration on the selected one of the first PLL/VCO 320 and the second PLL/VCO 330 in order to achieve the target frequency (e.g., frequency corresponding to allocated RBs or to assigned EARFCN). In some aspects, the control unit 210 may perform CT calibration on the selected one of the first PLL/VCO 320 and the second PLL/VCO 330, and allow the selected one of the first PLL/VCO 320 and the second PLL/VCO 330 to settle to the target frequency. Alternately, in some aspects, the control unit 210 may perform CT calibration on the selected one of the first PLL/VCO 320 and the second PLL/VCO 330, and perform two-point modulation (TPM) to achieve the target frequency.

The PLL selector 340 may be configured to receive one or more control signals from the control unit 210. According to one exemplary aspect, the PLL selector 340 may select a frequency divided signal generated by the first PLL/VCO 320 and the first divider 325 or by the second PLL/VCO 330 and by the second divider 335 to output to the transmit path 300 based on the one or more control signals from the control unit 210. The control unit 210 may be configured to cause the PLL selector 340 to perform the switch while a first symbol (e.g., symbol #0) is transmitted by the mobile communication device 110 according to the upcoming RB allocation. Additionally, the switch may be performed during a transmission of a cyclic prefix (CP) of a symbol (e.g., symbol #0).

The transmit path 300 may include a digital to analog converter (DAC) 302 configured to receive a digital signal from the control unit 210 and convert the digital signal into an analog signal. The transmit path 300 may further include a baseband filter (BBF) 304. The BBF 304 may be configured to receive the analog signal from the DAC 302. The BBF 304 may be further configured to receive one or more control signals from the control unit 210. Based on the one or more control signals from the control unit 210, the BBF 304 may be configured to modify a bandwidth of the analog signal received from the DAC 302 to produce a baseband signal (e.g., a filtered analog signal).

The transmit path 300 may include a mixer 306. The mixer 306 may be configured to modulate the frequency divided signal from the PLL selector 340 with the baseband signal from the BBF 304 to generate an up-converted signal. In some aspects, when the bandwidth of RB allocation is narrow (e.g., number of allocated RBs less or equal to x), the frequency divided signal from the PLL selector 340 may be at a frequency corresponding to the upcoming RB allocation (e.g., center frequency of upcoming RB allocation). Alternately, when the bandwidth of the RB allocation is not narrow (e.g., number of allocated RBs greater than x), the frequency divided signal from the PLL selector 340 may correspond to the assigned channel (e.g., center frequency of assigned EARFCN). The up-converted signal may have a frequency corresponding to the upcoming RB allocation (e.g., center frequency of upcoming RB allocation).

In various aspects, the BBF 304 may be configured to produce a baseband signal based on a specified frequency of the RB allocation and a tuned frequency of the frequency divided signal received at the transmit path 300 (e.g., from the PLL selector 340). For example, the frequency of the baseband signal generated by the BBF 304 may be adjusted such that modulating the baseband signal with the frequency divided signal generates an up-converted signal at the specified frequency of the upcoming RB allocation (e.g., center frequency of upcoming RB allocation).

The transmit path 300 may further include an amplifier (amp) 308. The amp 308 may be configured to amplify the up-converted signal from the mixer 306 for transmission.

The antenna 234 may receive the amplified signal from the amp 308 and transmit the amplified signal. For example, an amplified signal from the amp 308 may be transmitted to the communication network 120 (e.g., the first eNodeB 122 or the second eNodeB 124) on the subscription 115 via the antenna 234.

A person having ordinary skill in the art can appreciate that the RF module 232 may include additional and/or different components than shown in FIG. 3 without departing from the scope of the present disclosure. For example, although not shown, a person having ordinary skill in the art can appreciate that the RF module 232 may additionally include a receive path without departing from the scope of the present disclosure.

Figure 4:
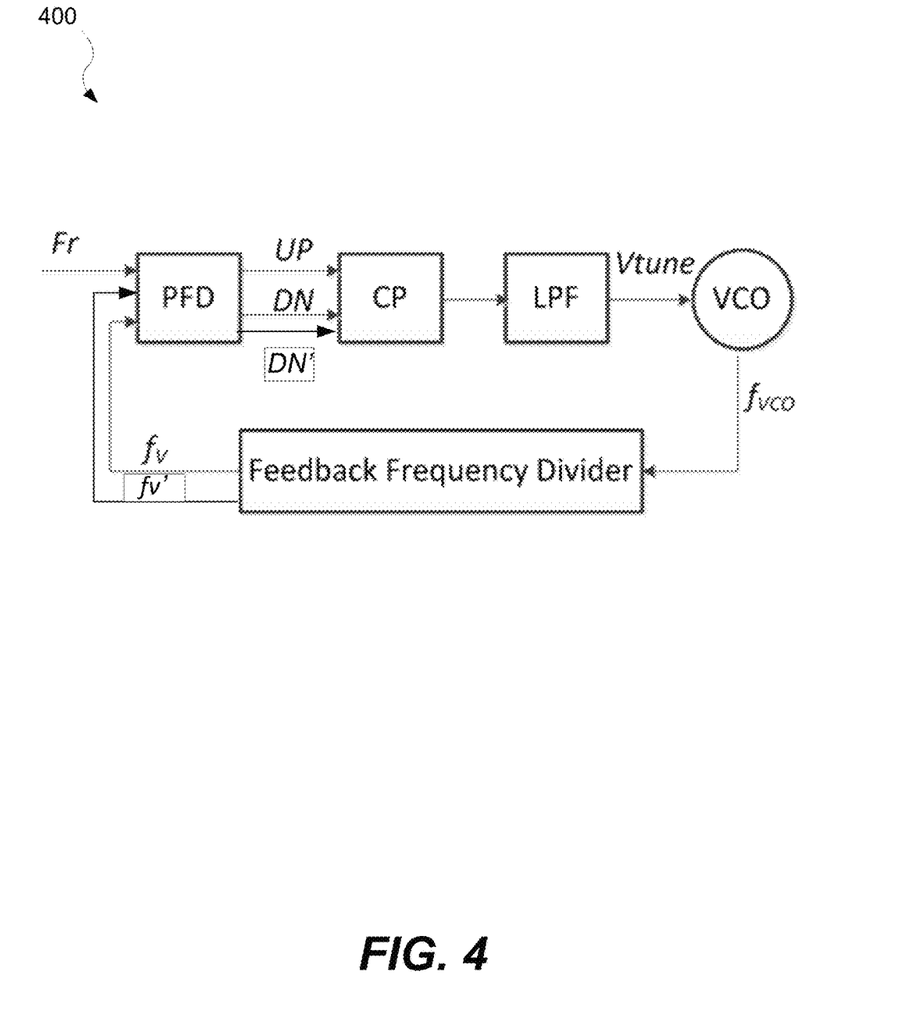
FIG. 4 is a block diagram illustrating an exemplary phase locked loop (PLL) for delta sigma modulation noise reduction in accordance with aspects of the present disclosure.

FIG. 4 is a block diagram illustrating an exemplary phase locked loop (PLL) 400 for delta sigma modulation noise reduction in accordance with aspects of the present disclosure. The PLL 400 includes a phase frequency detector (PFD), a charge pump (CP), a filter (e.g., loop filter), an oscillator (shown by way of example, but without limitation as a voltage controlled oscillator (VCO)), and a feedback frequency divider. The PLL configuration of FIG. 4 is merely exemplary for ease of illustration and understanding. Additional components and/or multiples of the identified components may also be included (e.g., two PFDs). The frequency divider may include a delay block (not shown) and may receive the output of the VCO as an input. Additional inputs, such as the output frequency of the PLL may also be supplied to the frequency divider.

Unlike conventional frequency dividers, the feedback frequency divider of FIG. 4 is configured to provide multiple frequency divider outputs (e.g., Fv and Fv'). Although, only two frequency divider outputs are shown, the present disclosure is not so limited, and any number of frequency divider outputs may be provided according to design preference. In one exemplary aspect, the signal Fv' is a delayed frequency that is one VCO cycle later than Fv. Both signals are supplied to the PFD and compared to the reference frequency Fr.

In some aspects, a weighting function may be applied to each of the frequency divider outputs. For example, a weighting function of 1 may be applied to Fr' and a weighting function of 0 may be applied to Fr, or vice versa. In a second example, a weighting function of 0.8 may be applied to Fr and a weighting function of 0.2 may be applied to Fr', or vice versa. Of course, the values of the weighting function are merely exemplary, and any value of weighting function may be applied to the frequency divider outputs. In one aspect, the values of the weighting functions may be constrained such that the sum of the applied weighting function is equal to one. Accordingly, the weighting functions may be set to match the fractional target frequency.

The PFD may compare the two frequency divider outputs to the reference frequency. The PFD may generate an up signal UP and a down signal corresponding to each of the frequency divider outputs DN and DN'. The UP/DN/DN' signals may be supplied to the charge pump. In the charge pump, the pulse width of UP/DN/DN' signals is converted to charge (e.g., pulse width*charge pump current). The charge may be supplied to the filter. The filter may, in some aspects, act as an integrator and may further convert the charge to a VCO tuning voltage. For example, the VCO tuning voltage (delta voltage) may be expressed as delta voltage=charge/ capacitance. Consequently, the change of the VCO tuning voltage (portioned to VCO frequency) may be expressed as {(pulse width of UP)*Iup−[(pulse width of DN)*Idn+(pulse width of DN')*Idn']}/Capacitance, where Iup and Idn are nominal values (e.g., 1 mA) for current sources included in the charge pump. In accordance with aspects of the present disclosure, Iup=Idn+Idn'. This is contrast with conventional PLL designs in which Iup=Idn and there is no additional source Idn'. Accordingly, the PFD and charge pump may perform interpolation such that an equivalent output phase may have finer resolution than the VCO period.

Figure 5:
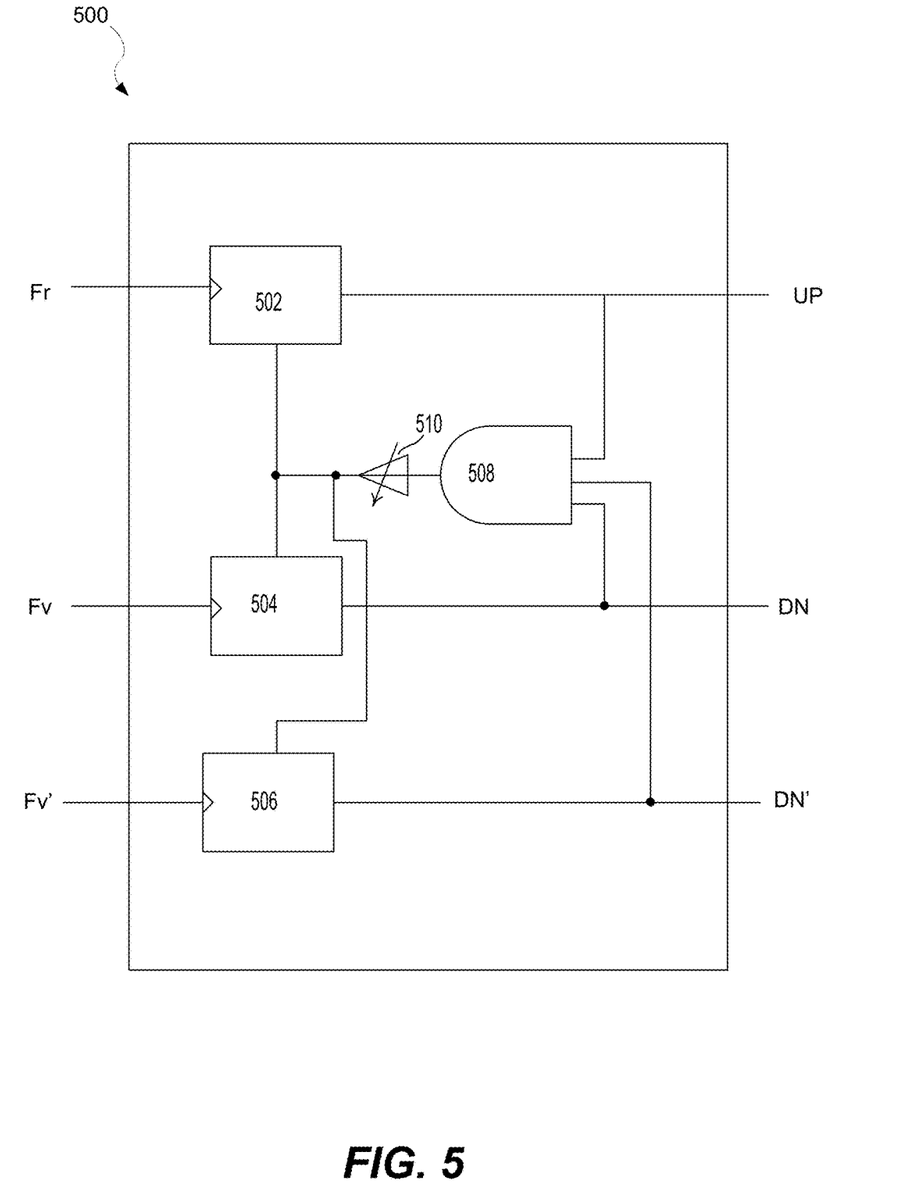
FIG. 5 is a block diagram illustrating an exemplary phase frequency detector (PFD) in accordance with aspects of the present disclosure.

FIG. 5 is a block diagram illustrating an exemplary phase frequency detector (PFD) 500 in accordance with aspects of the present disclosure. Referring to FIG. 5, the PFD 500 receives the frequency divider outputs Fv and Fv' along with the reference frequency Fr. Each of the input signals is supplied to a flip flop (e.g., 502, 504, 506). The input signals are used to generate a corresponding output to drive the charge pump under control of a feedback element 508 (e.g., shown as an AND gate). In the exemplary PFD 500, a delay element 510 is included after the feedback element 508. Of course, this is merely exemplary, and the other configurations may also be employed. For instance, the delay element 510 may be configured at the input port of the feedback element 508. The feedback element 508 may be used to reset the flip flops at the same time. For each flip flop (e.g., 502, 504, 506), the output changes to "1" when a rising edge of the input arrives, and changes (reset) to "0" when the AND gate output is "1" (after delay of 510). The PFD 500 generates an UP signal on the rising edge of the reference frequency Fr. Similarly, the PFD 500 generates DN and DN' at the rising edge of the frequency divider outputs Fv and Fv', respectively.

Figure 6:
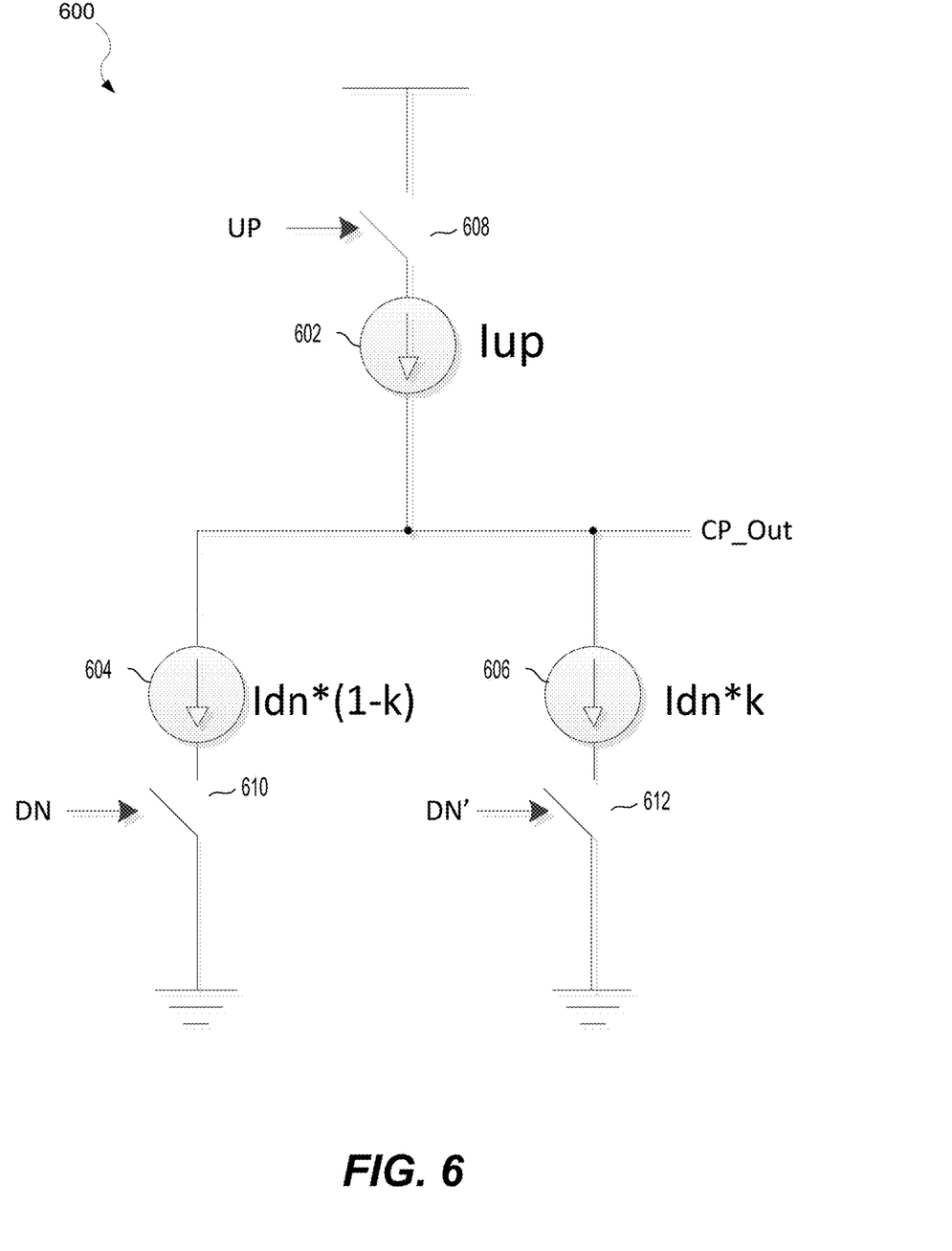
FIG. 6 is a diagram illustrating an exemplary charge pump in accordance with aspects of the present disclosure.

FIG. 6 is a diagram illustrating an exemplary charge pump 600 in accordance with aspects of the present disclosure. As shown in FIG. 6, the charge pump 600 includes multiple current sources (602, 604, 606). The charge pump 600 also includes switches that are respectively controlled according to the PFD outputs (e.g., UP, DN and DN'). That is, when the UP, DN and DN' are high (e.g., 1), a corresponding switch (e.g., 608, 610, 612) may be closed to activate a current source.

The current sources 604 and 606 have weighted outputs, which may be dynamically set for each reference cycle. As shown in the example of FIG. 6, the current source 604 may be set to Idn*(1-k) and the current source 606 may be set to Idn*k, where k is a real number and k<1. In some aspects, the value of k may be dynamically set via the control unit 210 (shown in FIG. 3). The current source 602 may be set to output Iup. Iup and Idn are nominal values (e.g., 1 mA). In one example, if the UP signal is high, the switch 608 may be closed and the current source Iup may output 1 mA. If variable k is set to 0.5, when DN is 1, the switch 610 may close and the current source 604 may output 0.5 mA. When DN' is 1, the switch 612 may close and the current source 606 may output 0.5 mA. In this way, the charge pump down current may be split into different ratios for DN1/DN2 to achieve phase interpolation. Accordingly, the charge pump output CP_Out may be given by the difference between the area under the signal curves for UP and DN'. By dynamically allocating the current in the down current branches (e.g., using variable k), an equivalent of fractional division may be achieved.

Figure 7:
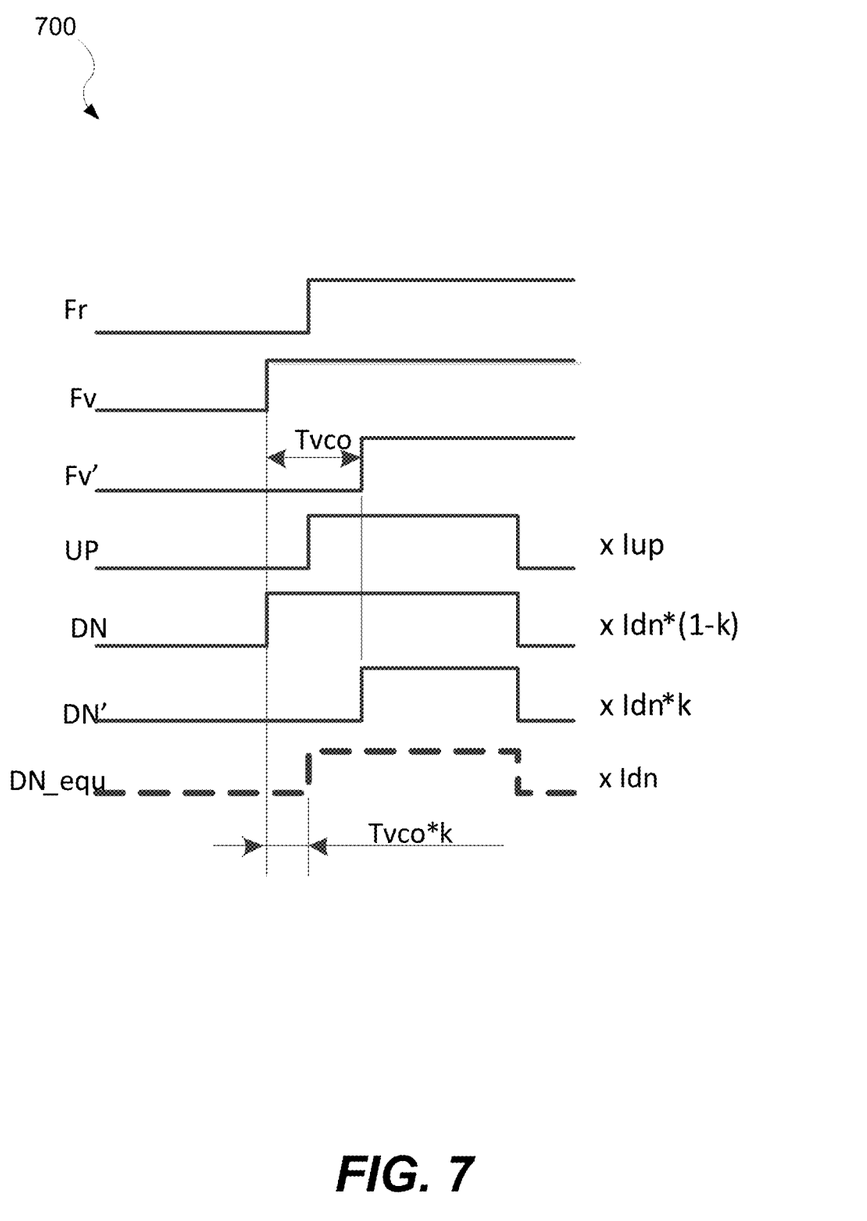
FIG. 7 is an exemplary timing diagram in accordance with aspects of the present disclosure.

FIG. 7 is an exemplary timing diagram 700 in accordance with aspects of the present disclosure. As shown in FIG. 7, divider frequency output Fv' is delayed by one VCO cycle (Tvco) relative to the frequency divider output Fv. Similarly, the PFD down signal output DN' is active or high one VCO cycle (Tvco) after PFD output DN is active or high. The charge pump down currents under the control of DN and DN' are respectively weighted Idn*(1-k) and Idn*k, as discussed above with respect to FIG. 6. Taking the difference between the time when the UP signal is high and when the down signal DN' is high results in an equivalent down signal DN_equ that is between DN and DN' and which has a pulse width that approximates or is equivalent to the pulse width of the UP signal. Thus, the charge pump output will be the equivalent of having a clock that is between Fv and Fv'. Accordingly, a fractional division ratio may be achieved without adding delta-sigma modulator (DSM) noise to the circuit.

Figure 8:
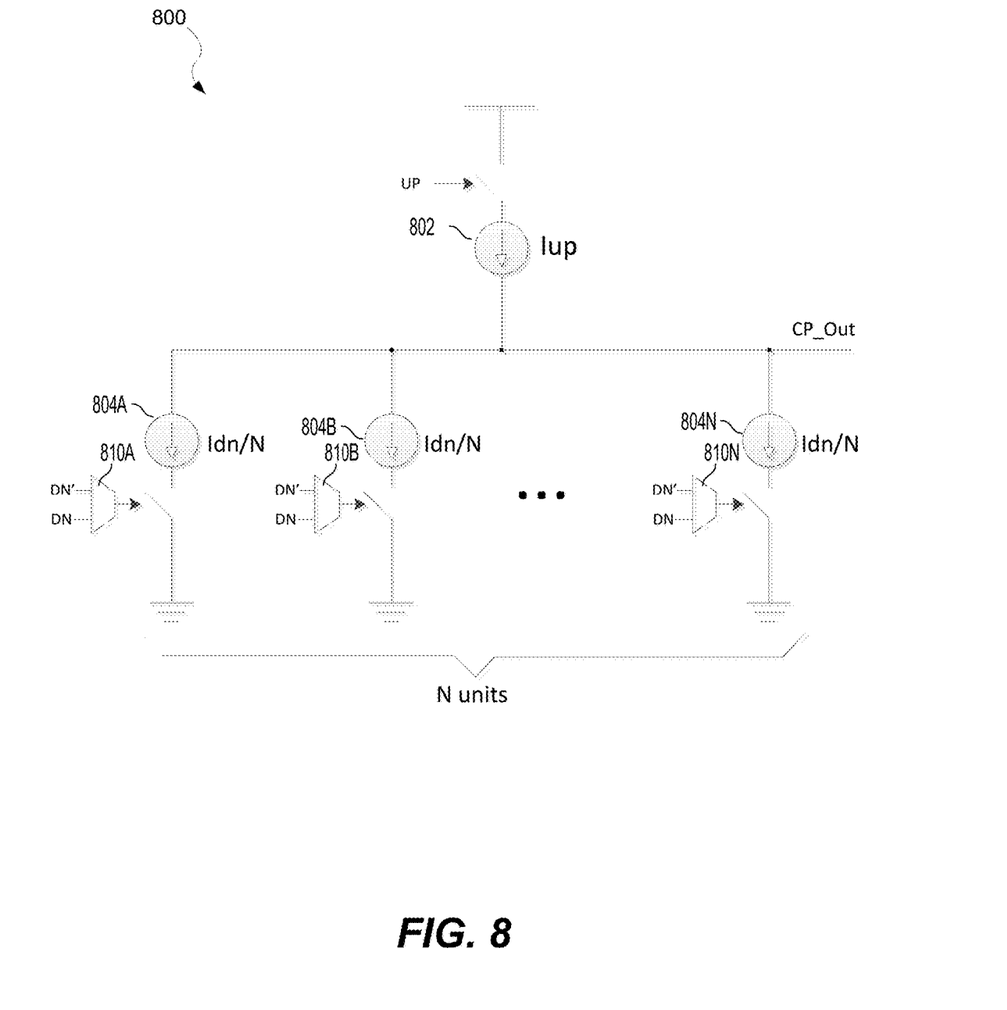
FIG. 8 is a diagram illustrating an exemplary charge pump in accordance with aspects of the present disclosure.

FIG. 8 is a diagram illustrating an exemplary charge pump 800 in accordance with aspects of the present disclosure. As shown in FIG. 8, the charge pump 800 may be configured with an up current source 802 and any number of down current branches (e.g., N units). Each of the branches may include a current source (e.g., 804A, 804B, . . . , 804N). In this example, the output of the current sources are equally weighted a fractional amount of the total current according to the number of branches (e.g., Idn/N). The current source for each branch is controlled via a multiplexor (MUX) (e.g., 810A, 810B, . . . , 810N). The MUX's output of each is based on the PFD outputs DN and DN'. In one configuration, the multiplexors are merged with existing UP/DN buffers. Because no additional delay cell is within the feedback path, no additional device noise is introduced.

Figure 9:
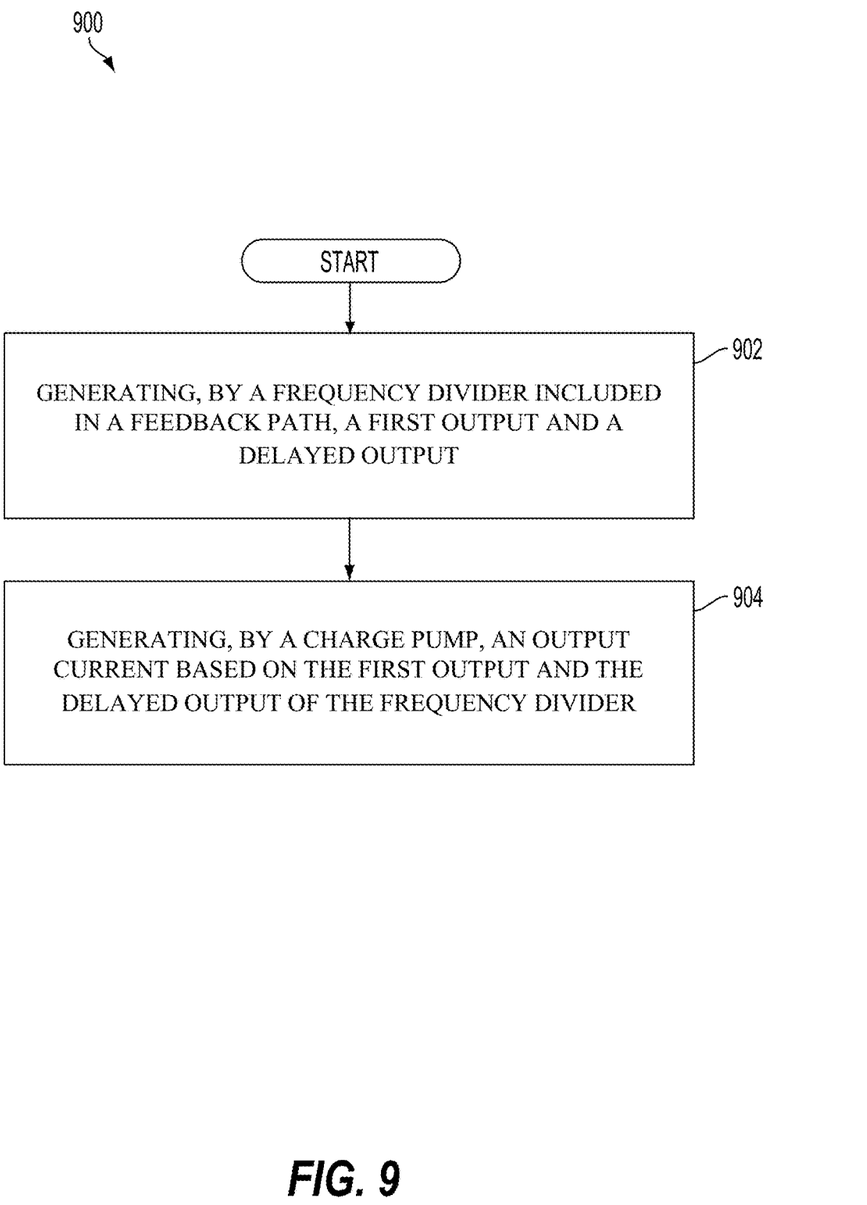
FIG. 9 is a process flow diagram illustrating a method for reducing noise in a phase locked loop according to an aspect of the present disclosure.

FIG. 9 is a process flow diagram illustrating a method 900 for reducing noise in a phase locked loop according to an aspect of the present disclosure. At block 902, the process generates a first output and a delayed output. The first output and the delayed output may be generated by a frequency divider included in a feedback path of the PLL, a first output and a delayed output. In some aspects, the delayed output may be delayed by a period of a voltage controlled oscillator of the PLL.

At block 904, the process generates an output current based on the first output and the delayed output of the frequency divider. The output current may be generated by the charge pump under the control of outputs produced via a phase frequency detector based on the first output and the delayed output. In some aspects, the charge pump output current may be based on a mixture of the output and the delayed output. The mixture may, in some aspects be applied to an up control of the charge pump, a down control of the charge pump or both. For example, as shown in FIGS. 6 and 8, the charge pump may include multiple current sources (e.g., 602, 604, 606, 802, 804A, 804B, 804N). Each of the current sources may be operated under the control of a control signal (e.g., UP control, DN and DN'). Furthermore, in one example, the multiple control signals may include two or more down control signals. Each of the down control signals may be used to control a current source of the charge pump such that the output current represents a phase interpolation based on a ratio of the current sources.

In some aspects, the output current of the charge pump may be generated based on a weighting function for a charge pump current. For example, as shown in FIG. 6, the current produced by each of the current sources may be weighted as a function of a variable k.

According to a further aspect of the present disclosure, a phase locked loop is described. The phased locked loop includes a means for generating a first output and a delayed output. The means for generating may, for example, comprise the frequency divider and VCO, as shown in FIG. 4 and a control unit as shown in FIGS. 2 and 3. The phased locked loop also includes means for generating an output current based on the first output and the delayed output of the frequency divider. The means for generating the output may, for example, comprise the charge pump shown in FIGS. 4, 6, and 8, a phase frequency detector 500, and/or the control unit 210 shown in FIGS. 2 and 3. In another aspect, the aforementioned means may be any layer, module, or any apparatus configured to perform the functions recited by the aforementioned means.

Figure 10:
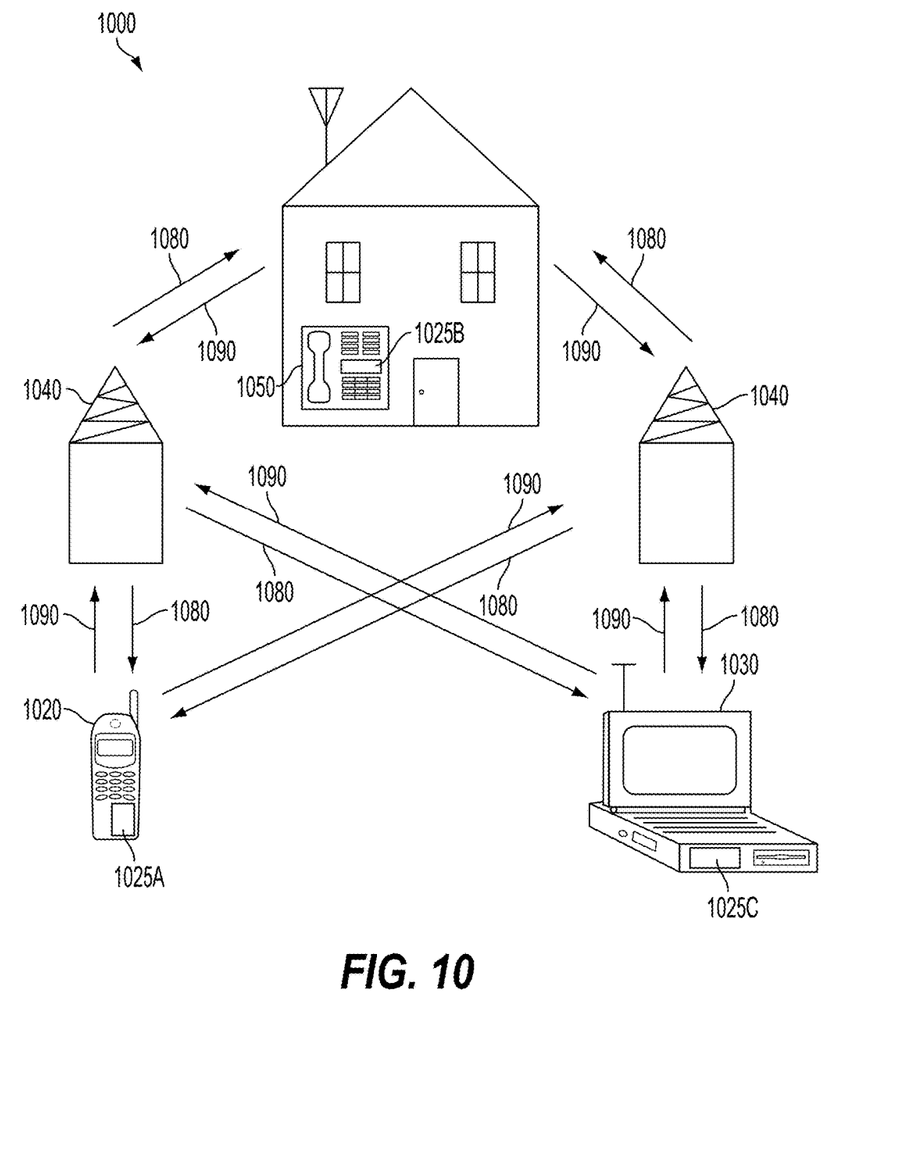
FIG. 10 is a block diagram showing an exemplary wireless communication system in which an aspect of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B having the disclosed phased lock loop module. It will be recognized that other devices may also include the disclosed phased lock loop, such as the base stations, user equipment, and network equipment. FIG. 10 shows forward link signals 1080 from the base station 1040 to the remote units 1020, 1030, and 1050 and reverse link signals 1090 from the remote units 1020, 1030, and 1050 to base station 1040.

In FIG. 10, remote unit 1020 is shown as a mobile telephone, remote unit 1030 is shown as a portable computer, and remote unit 1050 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed phased lock loop module.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. Accordingly, the scope of the present disclosure is intended to be defined only by reference to the appended claims.

What is claimed is:

1. A phase locked loop, comprising:
a frequency divider included in a feedback path, the frequency divider configured to generate a first frequency divider output and a delayed frequency divider output that is a delayed version of the first frequency divider output;
a charge pump to generate an output current based at least in part on the first frequency divider output and the delayed frequency divider output of the frequency divider; and
at least one phase frequency detector (PFD) coupled between the frequency divider and the charge pump, the at least one PFD generating multiple down control signals;
wherein the charge pump comprises multiple current sources, each of the multiple current sources being controlled based on a corresponding one of the down control signals to generate the output current, the output current comprising a phase interpolation based on the multiple current sources.

2. The phase locked loop of claim 1, further comprising a voltage controlled oscillator (VCO), in which the delayed frequency divider output is based at least in part on a cycle of the VCO.

3. The phase locked loop of claim 1, further comprising a delay block that generates the delayed frequency divider output.

4. The phase locked loop of claim 3, in which the frequency divider includes the delay block.

5. The phase locked loop of claim 1, in which the at least one PFD receives the first frequency divider output and the delayed frequency divider output as inputs.

6. The phase locked loop of claim 1, in which the at least one PFD outputs a control signal used by the charge pump to generate the output current.

7. The phase locked loop of claim 1, further comprising multiple phase frequency detectors, each of the phase frequency detectors further providing an up control signal and a down control signal to drive the charge pump to generate the output current.

8. The phase locked loop of claim 1, in which the charge pump generates the output current based on a mixture of the first frequency divider output from the frequency divider and the delayed frequency divider output.

9. A method of reducing noise in a phase locked loop comprising:
generating, by a frequency divider included in a feedback path, a first frequency divider output and a delayed frequency divider output that is a delayed version of the first frequency divider output;
generating, by a charge pump, an output current based at least in part on the first frequency divider output and the delayed frequency divider output of the frequency divider;
generating multiple control signals based at least in part on the first frequency divider output and the delayed frequency divider output, the multiple control signals used to generate the output current, the multiple control signals comprising at least two down control signals; and
applying the first frequency divider output to an up control of the charge pump and the delayed frequency divider output to a down control of the charge pump.

10. The method of claim 9, in which the generated output current is based on a mixture of the first frequency divider output from the frequency divider and the delayed frequency divider output.

11. The method of claim 9, further comprising generating the output current based at least in part on a weighting function for a charge pump current.

12. The method of claim 9, further comprising:
receiving, via at least one phase frequency detector, the first frequency divider output and the delayed frequency divider output as inputs.

13. The method of claim 9, in which each of the at least two down control signals is used to control a current source of multiple current sources of the charge pump such that the output current represents a phase interpolation based on the multiple current sources.

14. A phase locked loop comprising:
means for generating a first frequency divider output and a delayed frequency divider output that is a delayed version of the first frequency divider output;
means for generating an output current based at least in part on the first frequency divider output and the delayed frequency divider output;
means for generating multiple control signals based at least in part on the first frequency divider output and the delayed frequency divider output, the multiple control signals used to generate the output current, the multiple control signals comprising at least two down control signals; and
means for applying the first frequency divider output to an up control of the means for generating the output current and the delayed frequency divider output to a down control of the means for generating the output current.

15. The phase locked loop of claim 14, further comprising means for controlling one or more current sources to produce an up control of the means for generating the output current or a down control of the means for generating the output current.

16. The phase locked loop of claim 14, in which the output current is generated based at least in part on a weighting function for a current of the means for generating the output current.

17. The phase locked loop of claim 14, further comprising means for generating the delayed frequency divider output.

18. The phase locked loop of claim 14, further comprising at least one phase frequency detector coupled between the means for generating the first frequency divider output and the means for generating the output current.

19. The phase locked loop of claim 14, further comprising a first means for generating a first current and a second means for generating a second current, the first means for generating the first current and the second means for generating the second current being controlled according to a corresponding one of the multiple control signals such that the output current represents a phase interpolation based on the first current and the second current.

* * * * *